United States Patent
Hsu

(10) Patent No.: US 8,647,959 B2
(45) Date of Patent: Feb. 11, 2014

(54) METAL-INSULATOR-METAL CAPACITOR ALLOYING PROCESS

(75) Inventor: Chun-Chen Hsu, Taoyuan County (TW)

(73) Assignee: United Microelectronics Corp., Hsinchu (TW)

( * ) Notice: Subject to any disclaimer, the term of this patent is extended or adjusted under 35 U.S.C. 154(b) by 312 days.

(21) Appl. No.: 13/228,397

(22) Filed: Sep. 8, 2011

(65) Prior Publication Data

US 2012/0003829 A1    Jan. 5, 2012

Related U.S. Application Data

(62) Division of application No. 12/500,853, filed on Jul. 10, 2009.

(51) Int. Cl.
*H01L 21/20* (2006.01)
*H01L 21/44* (2006.01)
*H01L 21/00* (2006.01)

(52) U.S. Cl.
USPC ........... 438/396; 438/653; 438/658; 438/660; 438/661; 438/799; 257/E21.156

(58) Field of Classification Search
USPC ................. 438/396, 653, 658, 660, 661, 799; 257/E21.156
See application file for complete search history.

(56) References Cited

U.S. PATENT DOCUMENTS

| | | | |
|---|---|---|---|
| 4,778,739 A | 10/1988 | Protschka | |
| 5,194,102 A | 3/1993 | Wyss | |
| 6,717,193 B2 | 4/2004 | Olewine et al. | |
| 2003/0011043 A1* | 1/2003 | Roberts | 257/532 |
| 2005/0020061 A1 | 1/2005 | Fang et al. | |
| 2007/0152256 A1 | 7/2007 | Lizuka et al. | |
| 2007/0166979 A1 | 7/2007 | Wang et al. | |
| 2008/0191311 A1* | 8/2008 | Wang et al. | 257/532 |

FOREIGN PATENT DOCUMENTS

| | | |
|---|---|---|
| CN | 1801476 | 7/2006 |
| TW | 200727354 | 10/2008 |

OTHER PUBLICATIONS

Chinese Patent Office issued Office Action Jan. 31, 2013.

* cited by examiner

*Primary Examiner* — Kevin Parendo
(74) *Attorney, Agent, or Firm* — WPAT, PC; Justin King

(57) ABSTRACT

A method of fabricating a semiconductor device includes forming a bottom electrode material layer containing aluminum and copper over the substrate. An insulating material layer and a top electrode material layer are sequentially formed on the surface of the bottom electrode material layer. A photoresist pattern is formed on the top electrode material layer, and then the top electrode material layer is patterned to form a top electrode by using the photoresist pattern as mask. The photoresist pattern is removed by plasma ash and then an alloy process is performed to the bottom electrode material layer. Thereafter, the insulating material layer, and the bottom electrode material layer are patterned to form a patterned insulating layer and a patterned bottom electrode layer.

14 Claims, 4 Drawing Sheets

METAL-INSULATOR-METAL CAPACITOR ALLOYING PROCESS

CROSS-REFERENCE TO RELATED APPLICATION

The application is a divisional of an application Ser. No. 12/500,853, filed on Jul. 10, 2009, now pending. The entirety of each of the above-mentioned patent applications is hereby incorporated by reference herein and made a part of this specification.

BACKGROUND OF THE INVENTION

1. Field of the Invention

The present invention relates to a method of fabricating an integrated circuit. More particularly, the present invention relates to a method of fabricating semiconductor device.

2. Description of Related Art

With demands on light weight, thin, short and small size for marketing, the critical dimensions (CD) of semiconductor process is continuously developed toward smaller dimension. However, it is particularly important in controlling the resistance of each material layer, the profiles of patterns and the defects.

For example, in the case of metal-insulator-metal capacitors, since the stress migration (SM) efficiency of metal electrode is insufficient, the distribution of resistance shift is too board to adversely affect the charge storage characteristic of a capacitor. While a gap between two capacitors is decreased, and if etching residues remain between the capacitors, a bridging problem of the capacitors may be raised. In addition, a problem of short circuit may be generated if the control of electrode profiles of the capacitor is improper.

SUMMARY OF THE INVENTION

The present invention provides a method for fabricating a semiconductor device to improve the efficiency of stress migration.

The present invention provides a method for fabricating a semiconductor device to efficiently control the profile of a patterned conductive layer.

The present invention provides a method for fabricating a semiconductor device to prevent a bridging problem between patterned conductive layers.

The present invention provides a method of fabricating a semiconductor device. The method includes forming a bottom electrode material layer containing aluminum and copper on the substrate. Thereafter, an insulating material layer and a top electrode material layer are sequentially formed on the bottom electrode material layer. Next, a photoresist layer is formed on the top electrode material layer. A portion of the top electrode material layer is removed through an etching process by using the patterned photoresist layer as a mask. Subsequently, the patterned photoresist layer is removed by performing an ashing process. Thereafter, an alloy process is performed to the bottom electrode material layer. Then, the insulating material layer and the bottom electrode material layer are patterned by performing another etching process to form a patterned insulating layer, and a patterned bottom electrode layer. The patterned top electrode layer, the patterned insulating layer and the patterned bottom electrode layer together constitute a metal-insulator-metal capacitor.

According to an embodiment of the present invention, in the method of fabricating the semiconductor device, the alloy process is performed under a gas ambient or a vacuum environment. The gas ambient includes hydrogen, nitrogen or combination thereof. The alloy process is performed in a temperature ranging from 100° C. to 500° C. The alloy process is performed for the duration of 0.5 hour to 2 hours.

According to an embodiment of the present invention, in the method of fabricating the semiconductor device, the step of forming bottom electrode material includes forming a first barrier layer, a metal layer containing aluminum and copper and a second barrier layer sequentially.

According to an embodiment of the present invention, in the method of fabricating the semiconductor device, the first barrier layer and the second barrier layer respectively includes TaN, Ti, TiN, Ta or a combination thereof.

According to an embodiment of the present invention, in the method of fabricating the semiconductor device, the metal layer containing aluminum and copper is an aluminum-copper alloy layer or an aluminum-silicon-copper alloy layer.

According to an embodiment of the present invention, the method of fabricating the semiconductor device further includes before the insulating material layer is formed, performing a thermal treatment process to form a surface treatment layer on the surface of the bottom electrode material layer.

According to an embodiment of the present invention, in the method of fabricating the semiconductor device, the thermal treatment process is performed so as to translate the surface of the second barrier layer forms into the surface treatment layer.

According to an embodiment of the present invention, in the method of fabricating the semiconductor device, the thermal treatment process includes an ozone plasma process, an oxygen plasma process, or other kinds of plasma.

According to an embodiment of the present invention, in the method of fabricating the semiconductor device, the insulating material layer includes oxide, nitride, an oxide/nitride stacked layer, an oxide/nitride/oxide stacked layer or a combination thereof.

According to an embodiment of the present invention, in the method of fabricating the semiconductor device, the top electrode material layer includes TiN, Ti, Ta, TaN, aluminum or a combination thereof.

According to an embodiment of the present invention, in the method of fabricating the semiconductor device, the substrate has a multi-level interconnection already formed thereon.

The method of fabricating a semiconductor device of the present invention is capable of improving the efficiency of stress migration.

The method of fabricating a semiconductor device of the present invention is capable of suppressing hillocks formed on side walls of the patterned conductive layer, so that the profiles of the patterned conductive layer may be efficiently controlled.

The method for fabricating a semiconductor device of the present invention is capable of preventing the bridging problem between patterned conductive layers.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIGS. 1A through 1G are cross-sectional views schematically depicting a method of fabricating a semiconductor device according to an embodiment of the present invention.

Figure 1A:
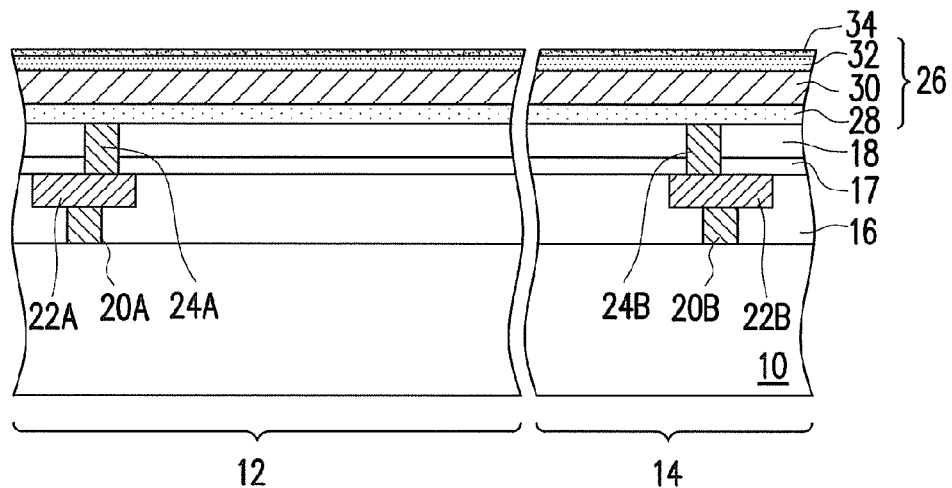
FIGS. 1A through 1G are cross-sectional views schematically depicting a method of fabricating a semiconductor device according to an embodiment of the present invention.

Referring to FIG. 1A, the substrate 10 comprises a first circuit region 12 and a second circuit region 14. The first circuit region 12 is a core circuit region, and the second circuit region 14 is a logic circuit region, for example. A dielectric layer 16 and a dielectric layer 18 are formed on the first circuit region 12 and the second circuit region 14 of the substrate 10. The dielectric layer 16 disposed on the first circuit region 12 has a via plug 20A and a wire 22A therein, and the dielectric layer 18 disposed on the first circuit region 12 has a via plug 24A therein. In addition, the dielectric layer 16 disposed on the second circuit region 14 has a via plug 20B and a wire 22B therein, and the dielectric layer 18 disposed on the second circuit region 14 has a via plug 24B therein. Transistors, other dielectric layers, other via plugs, and other metal wires etc. (not shown) may be further included between the dielectric layer 16 and the substrate 10. Besides, an etching stop layer or a polishing stop layer 17 can be further included between the dielectric layer 16 and the dielectric layer 18.

A conductive material layer 26, or named as an electrode material layer 26, is formed on the dielectric layer 18 and the via plugs 24A, 24B. In one embodiment of the present invention, the conductive material layer 26 includes a barrier layer 28, a metal layer 30 and a barrier layer 32. Materials of barrier layer 28 and the barrier layer 32 respectively includes TaN, Ti, TiN, Ta or a combination thereof. The metal layer 30 includes a metal layer containing aluminum and copper, such as an aluminum-copper alloy layer or an aluminum-silicon-copper alloy layer. The barrier layer 28, the metal layer 30 and the barrier layer 32 are formed by performing a physical vapor deposition process or a chemical vapor deposition process respectively, for example. The physical vapor deposition is sputtering deposition or evaporation, for example. For instance, the thickness of the barrier layer 28 and that of the barrier layer 32 may respectively range from about 300 angstroms to about 1000 angstroms. The thickness of the metal layer 30 is, for example, from 500 angstroms to 1000 angstroms. In one embodiment of the present invention, the barrier layer 28, the metal layer 30 and the barrier layer 32 are respectively formed as a TaN layer of about 500 angstroms, an aluminum-copper alloy layer of about 6000 angstroms, and a Ti of about 150 angstroms/TiN of about 400 angstroms layer by performing sputtering deposition methods. In another embodiment of the present invention, the barrier layer 28, the metal layer 30 and the barrier layer 32 are respectively formed as a TaN of about 500 angstroms/Ti with about 250 angstroms/TiN of about 250 angstroms layer, an aluminum-copper alloy layer with about 6000 angstroms, and a Ti of about 50 angstroms/TiN of 400 about angstroms layer by performing sputtering deposition methods.

Then, a thermal treatment process is performed to form a surface treatment layer 34 on the surface of the conductive material layer 26. When the conductive material layer 26 comprises the barrier layer 28, the metal layer 30 and the barrier layer 32, the surface of the barrier layer 32 is formed into the surface treatment layer 34 after performing the thermal treatment process. Compare to the case of lacking of the surface treatment layer 34, a better interface characteristics is provided between the surface treatment layer 34 and subsequently formed insulating layer 36 in this embodiment. The thermal treatment process is, for example, a plasma process, wherein the gas source introduced into the plasma chamber comprises a gas containing oxygen, and the formed surface treatment layer 34 comprises oxide layer, for example. The oxide layer comprises a titanium dioxide layer, for example. The gas containing oxygen introduced into the plasma process may be ozone, oxygen or with oxidation capability gas. In one embodiment, conditions of performing the plasma process may comprise the gas, such as about 1000 sccm to about 3000 sccm oxygen, introduced into the plasma chamber; the pressure ranges from about 600 mtorr to about 2000 mtorr; the temperature ranges from about 200° C. to about 400° C.; the performing time ranges from about 10 sec to about 300 sec.

Figure 1B:
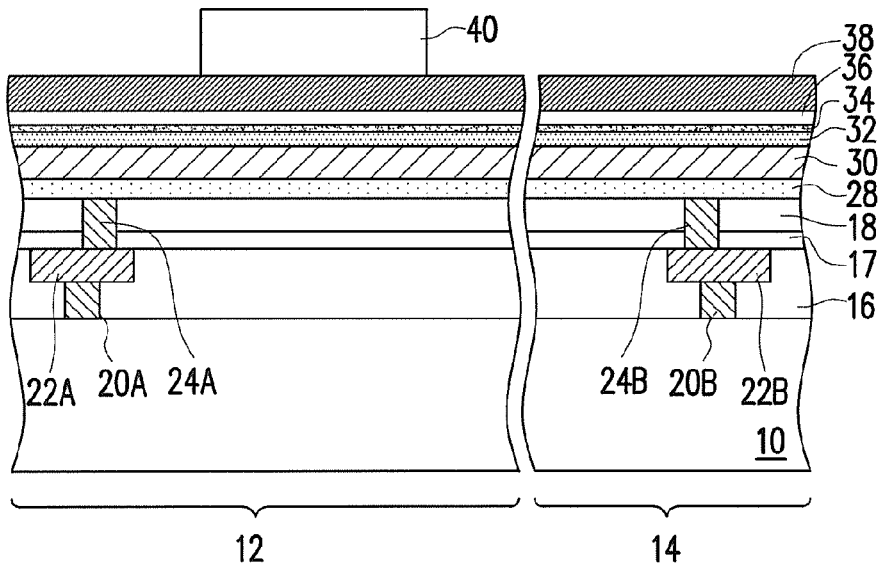

Next, referring to FIG. 1B, an insulating layer 36 is formed on the surface treatment layer 34. The insulating material layer 36 comprises oxide, nitride, an oxide/nitride stacked layer, an oxide/nitride/oxide stacked layer or a combination thereof. The insulating material layer 36 may be formed by performing a chemical vapor deposition (CVD) process. The thickness of the insulating material layer 36 may range from about 150 angstroms to about 1000 angstroms.

Afterward, another conductive material layer 38 which may be named as a top electrode material is further formed. The conductive material layer 38 comprises TiN, Ti, Ta, TaN, aluminum or a combination thereof. The thickness of the insulating material layer 38 may range from about 150 angstroms to about 1000 angstroms. The conductive material layer 38 may be formed through performing a physical vapor deposition (PVD) process or a chemical vapor deposition (CVD) process. The physical vapor deposition is sputtering deposition or evaporation, for example.

After that, a patterned photoresist 40 is formed on the conductive material layer 38 in the first circuit region 12, so as to define the pattern of the top electrode layer. A method of forming the patterned photoresist 40 may include procedures such as coating a photoresist material layer, soft baking, exposure, development, hard baking and so on.

Figure 1C:
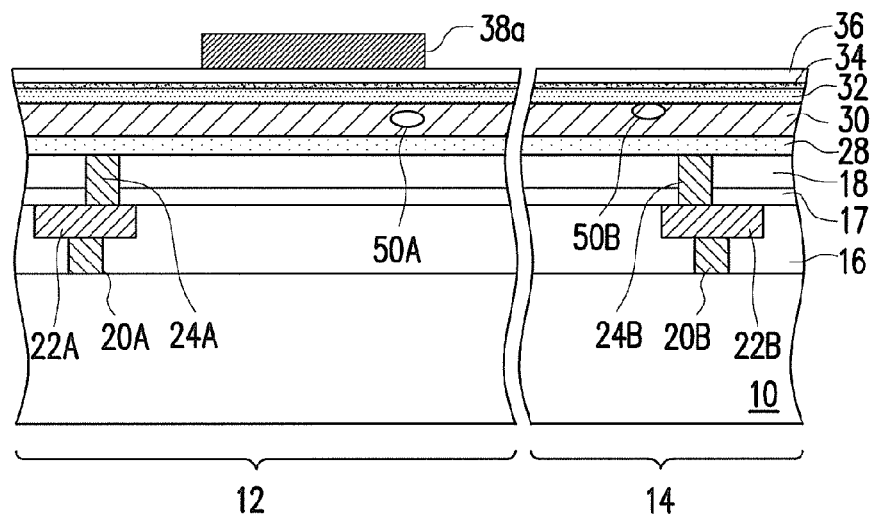

Afterward, referring to FIG. 1C, using the patterned photoresist layer 40 shown in FIG. 1B as a mask, an etching process is performed to the conductive material layer 38 exposed by patterned photoresist layer 40 until the insulating material layer 36 is exposed, so as to form a patterned conductive layer 38a on the first circuit region 12. Etching process can use a dry etching process or a plasma etching process. In one embodiment, during the etching process, except for removing the conductive material layer 38 exposed by the patterned photoresist 40, a half thickness of the insulating material layer 36 is further removed, so that a remained insulating material layer 36 still covers the surface treatment layer 34.

Then, the patterned photoresist layer 40 is removed by performing a wet removing process, a dry removing process or combination thereof, for example. The wet removing process may use acid or base. The dry removing method may perform a plasma ashing method.

Figure 1D:
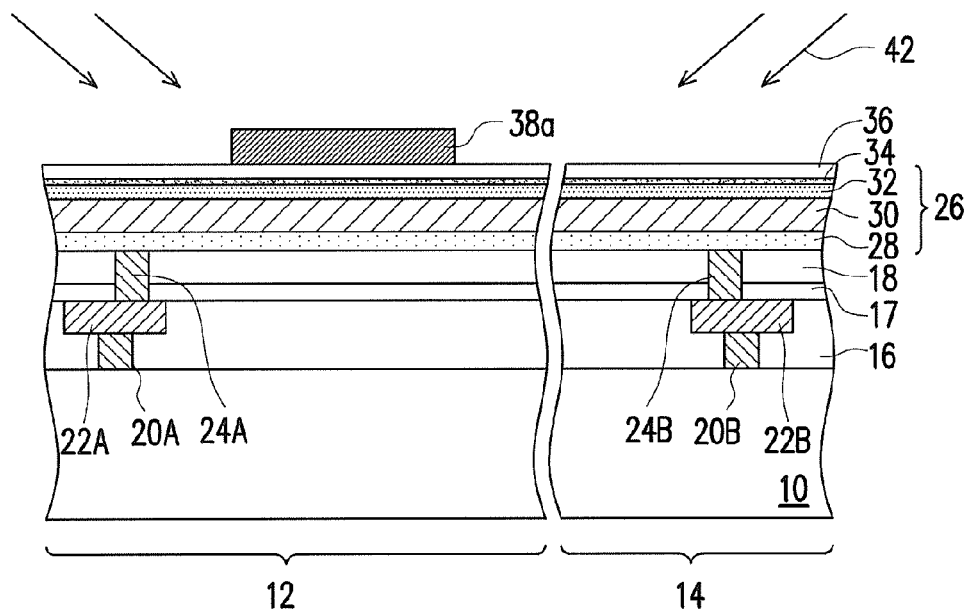

Next, referring to FIGS. 1C and 1D, the thermal processes performed on the conductive material layer 26 after being formed and before being patterned comprise a thermal treatment process, a deposition process of the insulating material layer, a photoresist baking process and a photoresist ashing process. The accumulated thermal budgets of those thermal processes is sufficient to provide metals, such as copper, in the conductive material layer 26 to diffuse and congregate, and thus precipitates 50A and 50B are formed. In one embodiment of the present invention, the conductive material layer 26 is first performed the alloy process 42 before being patterned. The alloy process 42 can be performed by using furnace or hot plate. The alloy process 42 is performed under a gas ambiance or vacuum environment, which contains hydrogen, nitrogen or a combination thereof, and performed in a temperature ranging from 100° C. to 500° C., and performed for a process time of 0.5 hour to 2 hour. In one embodiment, the alloy process 42 is performed in a furnace under a gas containing hydrogen, and performed in a temperature ranging from about 300° C. to about 450° C., and performed for a process time of about 0.5 hour to about 2 hours. In an embodiment of the present invention, the conductive material layer 26 is first performed the alloy process 42 before being patterned. As a result, not only the efficiency of the stress migration is improved, but also the precipitates 50A and 50B are dissolved into the conductive material layer 26. Consequently, the bridging problem generating from the precipitates 50A and 50B remaining within the finally formed patterned conductive layers may be avoided.

Figure 1E:
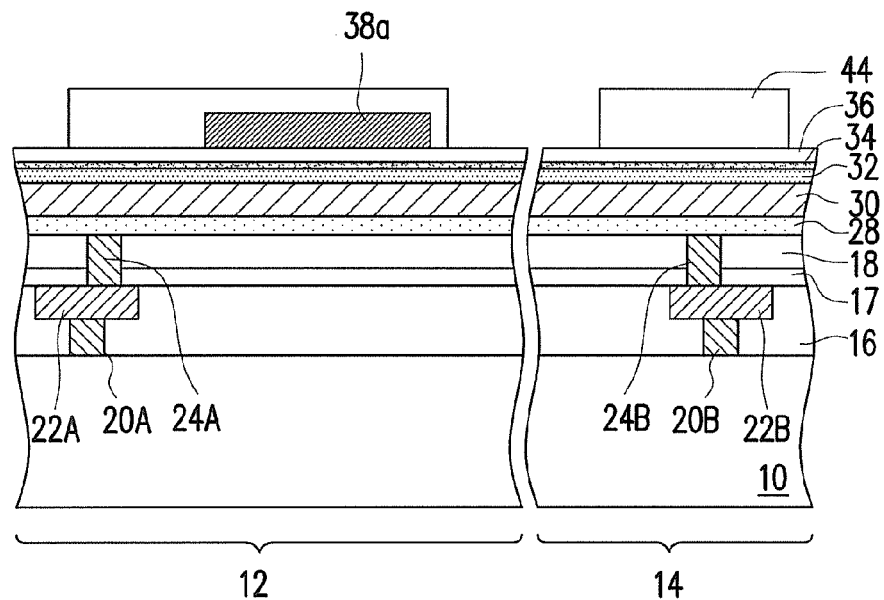

Thereafter, referring to FIG. 1E, a patterned photoresist layer 44 is formed on the substrate 10. Generally, to avoid the formed patterned photoresist 44 from peeling due to photoresist residues or contamination residues remaining on the top surface of the top electrode layer 38a or top surface of the insulating material layer 36, a surface plasma cleaning process is further performed before the patterned photoresist layer 44 is formed, such that the photoresist residues or contamination residues remaining on the top surface of the top electrode layer 38a or top surface of the insulating material layer 36 can be eliminated.

Figure 1F:
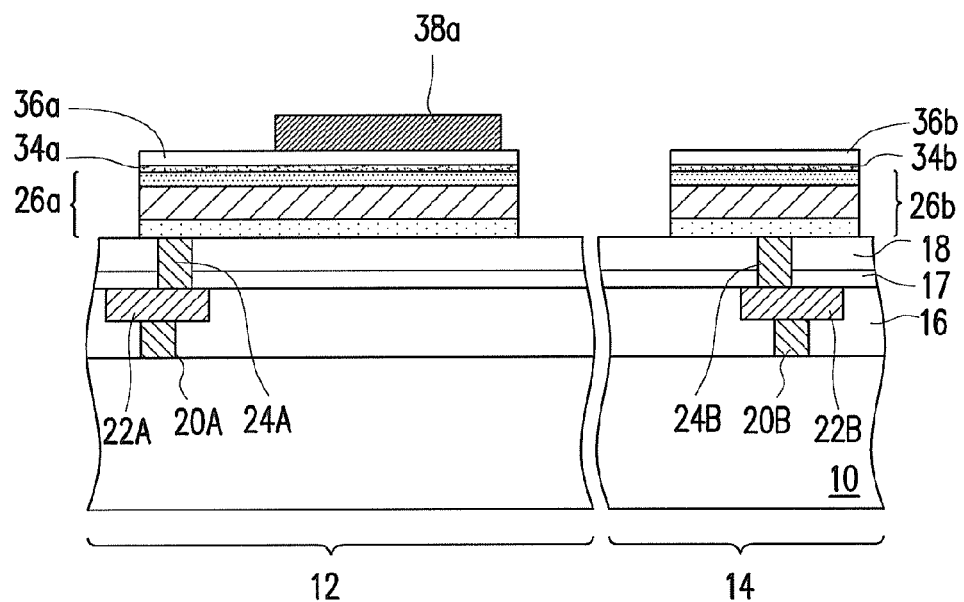

Afterward, referring to FIG. 1F, the insulating material layer 36, the surface treatment layer 34 and the conductive material layer 26 exposed by the patterned photoresist 44 are etched by using the patterned photoresist 44 shown in FIG. 1E as a mask, so as to form the patterned insulating layer 36a, the patterned surface treatment 34a and patterned conductive layer 26a in the first circuit region 12 and the patterned insulating layer 36b, the patterned surface treatment 34b and patterned conductive layer 26b in the first circuit region 14. The patterned conductive layer 26a, the patterned surface treatment layer 34a, the patterned insulating layer 36a and the patterned conductive layer 38a in the first circuit region 12 together constitute a metal-insulator-metal capacitor, wherein the patterned conductive layer 26a serves as a bottom electrode layer; the patterned conductive layer 38a serves as a top electrode layer; the patterned surface treatment layer 34a and the patterned insulating layer 36a serve as a dielectric layer between two electrodes. In one embodiment, the patterned conductive layer 26b in the second circuit region 14 can serve as a wire, and form metallic interconnects together with the via 24B, the wire 22B and the via 20B underneath. In another embodiment, the patterned conductive layer 26b in the second circuit region 14 can serve as a routing. In another embodiment, the patterned conductive layer 26b on the second circuit region 14 serves as a pad. After that, the photoresist layer 44 is removed. The method of removing photoresist layer 44 may perform a wet removing process, a dry removing process or combination thereof. The wet removing process may use acid or base. The dry removing method may perform a plasma ashing method.

Since no additional alloy process is carried out to the patterned conductive material layer 26a, 26b, the rearrangement of metal crystal lattices in the patterned conductive layer 26a, 26b can be avoided, therefore, the case of changing profiles of the patterned conductive layer 26a, 26b due to metal grains after rearranging forming hillocks at the sidewall of the patterned conductive layer 26a, 26b can be avoided.

Figure 1G:
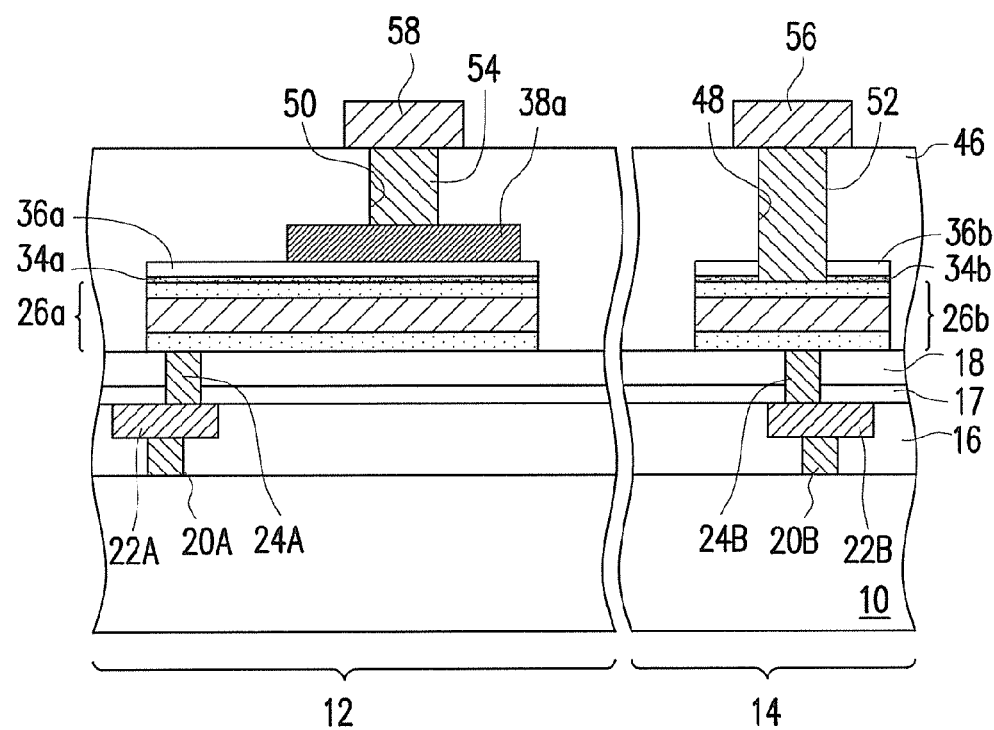

Afterward, referring to FIG. 1G, a dielectric layer 46 is formed on the substrate 10. The material of the dielectric layer 46 includes silicon oxide, boron phosphorous silicon glass (BPSG), phosphorous silicon glass (PSG), or silicon nitride, for example. The dielectric layer 46 is formed by chemical vapor deposition, for example. Thereafter, a portion of the dielectric layer 46, a portion of patterned insulating layer 36b and a portion of the patterned surface treatment layer 34b are etched by using a photolithography and etching process, so as to form an via opening 48 to expose the patterned conductive layer 26b and an via opening 50 to expose the patterned conductive layer 38a. Thereafter, a conductive layer such as tungsten is filled into the via openings 48 and 50 to form via 52 and via 54. Thereafter, wire lines 56, 58 are formed on the dielectric layer 46 to electrically connect to the vias 52, 54. The material of the wire lines 56, 58 is aluminum or aluminum alloy, for example.

In the embodiment of the present invention, the alloy process 42 is performed before the conductive material layer 26 is patterned. After the formed semiconductor device is baked the duration of 500 hours, the experimental results indicated that not only the efficiency of stress migration is improved but also the distribution of the resistance shift is smaller than 5%. Besides, the precipitates 50A, 50B in the conductive material layer 26 can further be dissolved through the alloy process 42. Since the precipitates 50A, 50B are already dissolved into the conductive material layer 26 before the conductive material layer 26 is patterned, therefore, after the patterned conductive layer 26 and 26b are formed by patterning the conductive material layer 26, the bridging problem raising by the remaining of the precipitates can be prevented. In addition, no additional alloy process is carried out after the patterned conductive layer 26a, 26b are formed, the situation of changing profiles of the patterned conductive layer 26a, 26b due to metal grains after rearranging forming hillocks at the sidewall of the patterned conductive layer 26a, 26b can be avoided.

In contrary, if the alloy process 42 is performed after the patterned conductive layer 26a and 26b are formed, rather than being performed before the conductive material layer 26 is patterned. After the formed semiconductor device is baked the duration of 500 hours, the experimental results indicated that although the efficiency of stress migration can be improved, the distribution of the resistance shift is worse, greater than 20% by the above two cases. Moreover, the precipitates 50A, 50B in the conductive material layer 26 is unable to be removed during the conductive material layer 26 is patterned, and then causes bridging problem of the finally formed semiconductor device. In addition, the lattice is rearranged in the patterned conductive layer 26a, 26b during the alloy process, so that the profile of the patterned conductive layer 26a, 26b may be changed because metal grain hillocks are formed at the sidewall of the patterned conductive layer 26a, 26b.

In summary, the method of fabricating the semiconductor device of the present invention is that first performing an alloy process before the conductive material layer, which has already undergone a plurality of thermal processes and already precipitated precipitates therein is patterned. By using the method, for one aspect, the efficiency of the stress migration can be improved; for another aspect, the precipitates in the conductive material layer dissolved thereinto such that the bridging problem generating from remaining the precipitates within the finally formed patterned conductive layers can be avoided. In addition, since no additional alloy process is carried out after the conductive material layer is patterned, therefore, the rearrangement of metal crystal lattices in the patterned conductive layer can be avoid, and thus the profile change of the patterned conductive layer due to hillocks formed at the sidewall of the patterned conductive layer can be avoid.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method of fabricating a semiconductor device, comprising:
    forming a bottom electrode material layer containing aluminum and copper on a substrate;
    forming an insulating material layer and a top electrode material on the bottom electrode material layer in sequence;
    forming a patterned photoresist layer on the top electrode material layer;
    using the patterned photoresist layer as a mask, performing an etching process to remove a portion of the top electrode material layer so as to form a patterned top electrode layer;
    removing the photoresist layer by an ashing process;
    performing an alloy process to the bottom electrode material layer after removing the patterned photoresist layer; and
    performing another etching process to pattern the insulating material layer and the bottom electrode material layer and to expose a portion of the bottom electrode material layer so as to form a patterned insulating layer and a patterned bottom electrode layer after performing the alloy process, wherein the patterned top electrode layer, the patterned insulating layer and the patterned bottom electrode layer together constitute a metal-insulator-metal capacitor.

2. The method of fabricating the semiconductor device as claimed in claim 1, wherein the alloy process is performed under a gas ambient or vacuum environment, the gas ambient comprises hydrogen, nitrogen or combination thereof.

3. The method of fabricating the semiconductor device as claimed in claim 1, wherein a temperature for performing the alloy process is in a range from 100° C. to 500° C.

4. The method of fabricating the semiconductor device as claimed in claim 1, wherein the alloy process is performed for a duration of 0.5 hour to 2 hours.

5. The method of fabricating the semiconductor device as claimed in claim 1, wherein the step of forming the bottom electrode material layer comprises: forming a first barrier layer over the substrate; forming a metal layer containing aluminum and copper on the first barrier layer; and forming a second barrier layer on the metal layer containing aluminum and copper.

6. The method of fabricating the semiconductor device as claimed in claim 5, wherein the first barrier layer and the second barrier layer are respectively comprises TaN, Ti, TiN, Ta or a combination thereof.

7. The method of fabricating the semiconductor device as claimed in claim 5, wherein the metal layer containing aluminum and copper comprises an aluminum-copper alloy layer or an aluminum-silicon-copper alloy layer.

8. The method of fabricating the semiconductor device as claimed in claim 5, further comprising, before the insulating layer is formed, performing a thermal treatment process to form a surface treatment layer on a surface of the bottom electrode material layer.

9. The method of fabricating the semiconductor device as claimed in claim 8, wherein a surface of the second barrier layer forms into the surface treatment layer by performing the thermal treatment process.

10. The method of fabricating the semiconductor device as claimed in claim 8, wherein the thermal treatment process comprises an ozone plasma process, or an oxygen plasma process.

11. The method of fabricating the semiconductor device as claimed in claim 10, wherein the insulating material layer comprises oxide, nitride, an oxide/nitride stacked layer, an oxide/nitride/oxide stacked layer or a combination thereof.

12. The method of fabricating the semiconductor device as claimed in claim 1, wherein the insulating material layer comprises oxide, nitride, an oxide/nitride stacked layer, an oxide/nitride/oxide stacked layer or a combination thereof.

13. The method of fabricating the semiconductor device as claimed in claim 1, wherein the top electrode material layer comprises TiN, Ti, Ta, TaN, aluminum or a combination thereof.

14. The method of fabricating the semiconductor devices as claimed in claim 1, wherein the substrate has a multi-level interconnection formed thereon.

* * * * *